(12) United States Patent
Weyers et al.

(10) Patent No.: US 6,750,652 B2
(45) Date of Patent: Jun. 15, 2004

(54) INTEGRATED QUADRATURE SPLITTER-COMBINER AND BALUN

(75) Inventors: Daniel Weyers, Wauwatosa, WI (US); Ken Hsieh, Waukesha, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/065,465

(22) Filed: Oct. 22, 2002

(65) Prior Publication Data

US 2004/0075435 A1 Apr. 22, 2004

(51) Int. Cl.[7] .............................................. G01V 3/00
(52) U.S. Cl. ...................................... 324/318; 324/322
(58) Field of Search ................................. 324/318, 322, 324/300, 306, 309; 600/423; 375/324; 128/653; 332/167; 330/277

(56) References Cited

U.S. PATENT DOCUMENTS

| | | | |
|---|---|---|---|
| 4,916,410 A | 4/1990 | Littlefield | 330/295 |
| 5,343,171 A * | 8/1994 | Fox et al. | 332/167 |
| 6,249,121 B1 * | 6/2001 | Boskamp et al. | 324/318 |
| 6,320,385 B1 * | 11/2001 | Burl et al. | 324/322 |
| 6,351,502 B1 * | 2/2002 | Zargari | 375/324 |
| 6,504,433 B1 * | 1/2003 | Weber et al. | 330/277 |

* cited by examiner

*Primary Examiner*—Brij B. Shrivastav
(74) *Attorney, Agent, or Firm*—Cantor Colburn LLP

(57) ABSTRACT

An integrated quadrature splitter-combiner and balun comprising: a transmission line balun operably connected to a first port and a second port; a first capacitor operably connected across the transmission line balun; a second capacitor operably connected to the first port and said balun; and a third capacitor operably connected to the second port and the balun. The second capacitor, the third capacitor, and the transmission line balun combine to form an RF splitter-combiner to split a balanced RF signal received at the first port into a first and second unbalanced quadrature RF signal transmitted at the second port and combines the first and second unbalanced quadrature RF signals received at the second port into the balanced RF signal transmitted at the first port.

25 Claims, 3 Drawing Sheets

INTEGRATED QUADRATURE SPLITTER-COMBINER AND BALUN

BACKGROUND OF INVENTION

The field of the invention is radio frequency (RF) signal transmission, transmission lines and balanced to unbalanced impedance transformation and simultaneously to split a single balanced input RF signal into a first and second quadrature unbalanced RF output signals. Similarly, the combination of a first and second unbalanced quadrature RF input signals may be combined into a single RF output signal. It will be appreciated, however, that the invention is also amenable to other like applications.

Magnetic resonance imaging (MRI) tomography is a known technique for acquiring images of the inside of the body of a living examination subject. To this end, magnetic gradient fields and an RF field, which are generated by gradient and RF coils respectively, are superimposed on a static magnetic field. The gradient fields that influence the examination subject are characterized by a magnetic flux density that varies over time, which may be utilized for imaging techniques. In certain MR systems, birdcage RF coils are employed, which require quadrature excitation and reception. Such quadrature excitation and reception is commonly achieved with a 90 (ninety) degree splitter-combiner. Additionally, to reduce system noise and cable currents, a balanced to unbalanced (balun) transformer is commonly employed.

It is well known in the art that a typical RF power transmission requires some form of RF power amplifier and transmission line. The interfacing of RF componentry usually requires the amplification, combination, and splitting of RF signals. The combination is usually performed by a splitter-combiner, which may further require the use of a balun or transformer. The balun performs a balanced-to-unbalanced (balun) transformation.

Commonly in the art, a power amplifier circuit must be cascaded with balun impedance transformers to match the impedance of the amplifier. Thus, the prior art requires a power amplifier cascaded with the balun impedance transformers to enable RF power to be split, amplified and then recombined at a higher power level.

Utilizing separate components for each function adds size cost and weight to existing MRI systems. What is needed in the art is a quadrature splitter-combiner integrated with a balun transformer.

SUMMARY OF INVENTION

The above discussed and other drawbacks and deficiencies are overcome or alleviated by an integrated quadrature splitter-combiner and balun comprising: a transmission line balun operably connected to a first port and a second port; a first capacitor operably connected across the transmission line balun; a second capacitor operably connected to the first port and said balun; and a third capacitor operably connected to the second port and the balun. The second capacitor, the third capacitor, and the transmission line balun combine to form an RF splitter-combiner to split a balanced RF signal received at the first port into a first and second unbalanced quadrature RF signal transmitted at the second port and combines the first and second unbalanced quadrature RF signals received at the second port into the balanced RF signal transmitted at the first port.

Also disclosed herein an exemplary embodiment is an integrated quadrature splitter and balun comprising: a transmission line balun operably connected to a first port and a second port; a first capacitor operably connected across the transmission line balun; a second capacitor operably connected to the first port and the balun; and a third capacitor operably connected to the second port and the balun. The second capacitor, the third capacitor, and the transmission line balun combine to form an RF splitter to split an balanced RF signal received at the first port into a first and second unbalanced quadrature RF signals transmitted at the second port.

Further, disclosed herein another exemplary embodiment is an integrated quadrature combiner and balun comprising: a transmission line balun operably connected to a first port and a second port; a first capacitor operably connected across the transmission line balun; a second capacitor operably connected to the first port and the balun; and a third capacitor operably connected to the second port and the balun. The second capacitor, the third capacitor, and the transmission line balun combine to form an RF combiner to combine an unbalanced quadrature RF signal received at the second port into a balanced RF signal transmitted at the first port.

Disclosed herein in yet another exemplary embodiment is an imaging system comprising: a imaging system with quadrature RF coils; an integrated quadrature splitter or combiner and balun comprising: a transmission line balun operably connected to a first port and a second port; a first capacitor operably connected across the transmission line balun; a second capacitor operably connected to the first port and said balun; and a third capacitor operably connected to the second port and the balun. The second capacitor, the third capacitor, and the transmission line balun combine to form an RF splitter or combiner to either split a balanced RF signal received at the first port into a first and second unbalanced quadrature RF signals transmitted at the second port or to combine the first and second unbalanced quadrature, RF signals received at the second port into the balanced RF signal transmitted at the first port.

Also disclosed herein is a magnetic resonance imaging system comprising: a magnetic resonance imaging system with quadrature RF coils; an integrated quadrature splitter-combiner and balun comprising: a transmission line balun operably connected to a first port and a second port; a first capacitor operably connected across the transmission line balun; a second capacitor operably connected to the first port and the balun; and a third capacitor operably connected to the second port and the balun. The second capacitor, the third capacitor, and the transmission line balun combine to form an RF splitter or combiner to either split a balanced RF signal received at the first port into a first and second unbalanced quadrature RF signals transmitted at the second port and to combine the first and second unbalanced quadrature RF signals received at the second port into the balanced RF signal transmitted at the first port.

In another exemplary embodiment, disclosed herein is a method of splitting a balanced RF signal into unbalanced quadrature RF signals comprising: receiving a balanced RF signal at first port of an integrated quadrature splitter and balun, the integrated quadrature splitter and balun comprising: a transmission line balun operably connected to a first port and a second port; a first capacitor operably connected across the transmission line balun; a second capacitor operably connected to the first port and the balun; and a third capacitor operably connected to the second port and the balun. The second capacitor, said third capacitor, and said transmission line balun combine to form an RF splitter. The method also includes generating a first and second unbalanced quadrature RF signals transmitted at the second port.

In yet another exemplary embodiment, there is disclosed herein a method of combining unbalanced quadrature RF signals into a balanced RF signal comprising: receiving a first and a second unbalanced quadrature RF signals at second port of an integrated quadrature combiner and balun, the integrated quadrature combiner and balun comprising: a transmission line balun operably connected to a first port and a second port; a first capacitor operably connected across the transmission line balun; a second capacitor operably connected to the first port and the balun; and a third capacitor operably connected to the second port and the balun. The second capacitor, the third capacitor, and the transmission line balun combine to form an RF combiner. The method also includes generating a balanced RF signal transmitted at the first port.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Disclosed herein is a quadrature splitter-combiner with balun. Also disclosed herein is a magnetic resonance imaging system (MRI) incorporating the abovementioned quadrature splitter-combiner with balun with quadrature RF coils.

Figure 1:
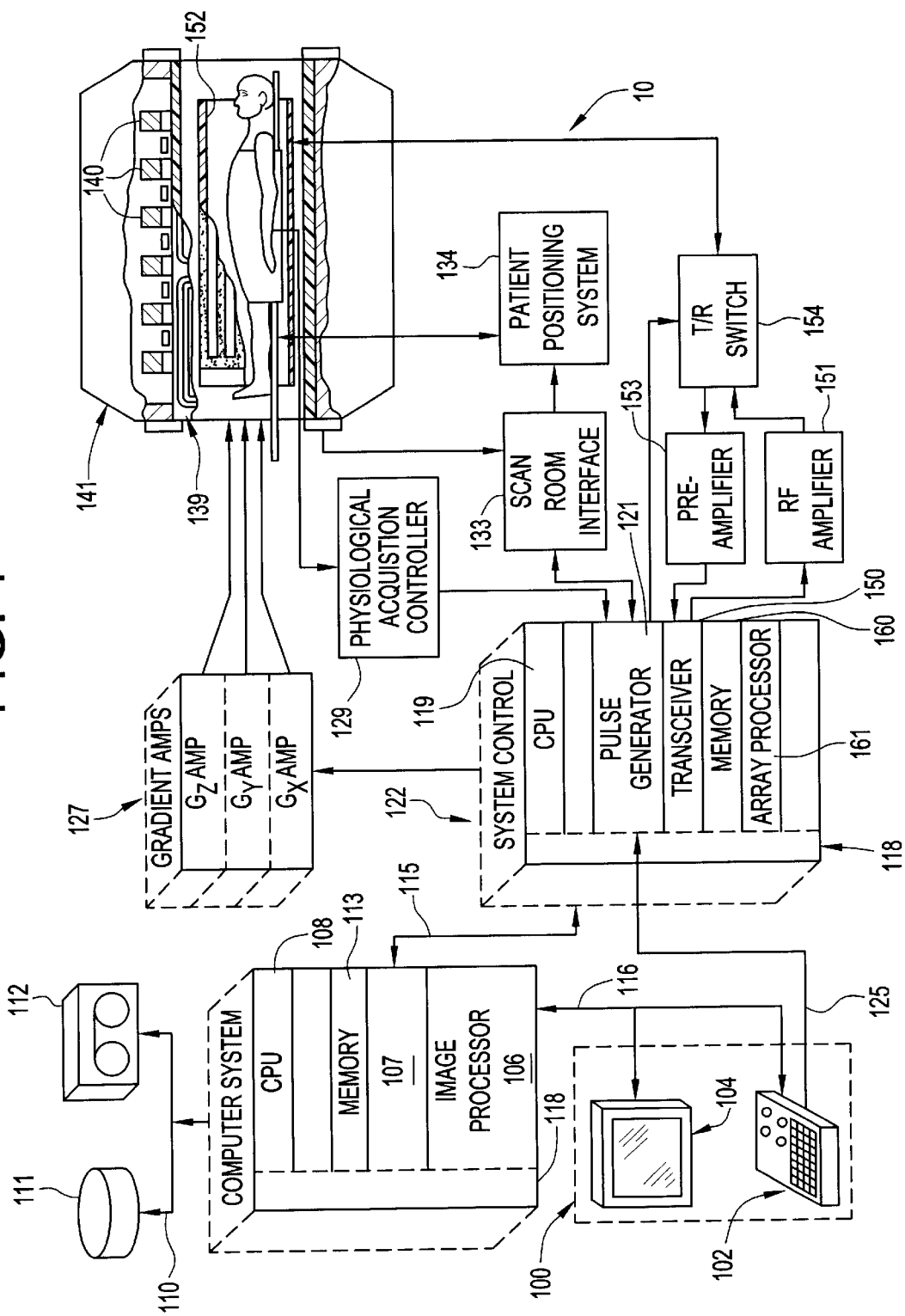
FIG. 1 depicts an exemplary MRI system.

Referring to FIG. 1, there is shown the major components of an exemplary MRI system, within which an exemplary embodiment may be implemented. The operation of the system is controlled from an operator console 100, which includes a keyboard and control panel 102 and a display 104. The console 100 communicates through a link 116 with a separate computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to storage media 111 and 112, depicted as disk storage and a tape drive respectively for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator that indicate the scan sequence that is to be performed. As will be described in more detail below, the operator enters parameters, which indicate the prescribed scan. From these parameters, a pulse sequence is calculated and downloaded to the pulse generator module 121.

The pulse generator module 121 operates the system components to carry out the desired scan sequence. It produces data, which indicates the timing, strength and shape of the RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. Finally, the pulse generator module 121 connects to a scan room interface circuit 133, which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier 127 comprised of $G_x$, $G_y$, and $G_z$ amplifiers. Each gradient amplifier 127 excites a corresponding gradient coil in an assembly generally designated 139 to produce the magnetic field gradients used for position encoding acquired signals. The gradient coil assembly 139 forms part of a magnet assembly 141, which includes a polarizing magnet 140 and a whole-body RF coil 152. A transceiver module 150 in the system control 122 produces pulses, which are amplified by an RF amplifier 151 and coupled to the RF coil 152 by a transmit/receive switch 154 and quadrature splitter-combiner. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil 152 during a transmit mode and to connect the preamplifier 153 during a receive mode. The transmit/receive switch 154 also enables a separate RF coil 152 (for example, a head coil or surface coil) to be used in either the transmit mode or receive mode. A decoupling method is used to switch on/off a large body coil during transmit/receive respectively. Other options include using another transmit/receive coil, such as a miniature body coil for the head, and leaving the system body coil in an off state during the entire scanning with the head coil. In an exemplary embodiment, the combiner disclosed herein may be employed to split the transmit RF signal and combine the receive signal(s) to and from the various coils.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in a storage medium 111 or 112 such as disk memory or tape drive. The storage medium 111 and 112 could be various storage methodologies, such as disk, static memory, solid state, removable media, and the like, as well as combinations including at least one of the foregoing. In response to commands received from the operator console 100, this image data may be archived on the tape drive, or it may be further processed by the image processor 106, and conveyed to the operator console 100 and presented on the display 104.

Referring still to FIG. 1 the NMR signal produced by the subject is picked up by the receiver coil 152 and applied through the preamplifier 153 to the input of a transceiver 150. The received signal is at or around the Larmor frequency of a hydrogen atom, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor. The resulting stream of values of the received signal are output through backplane 118 to the memory module 160 and array processor 161 where they are employed to reconstruct an image.

Disclosed herein is an integrated quadrature splitter-combiner with balun. Also disclosed herein is a magnetic resonance imaging system (MRI) incorporating the above-mentioned quadrature splitter-combiner with balun for quadrature RF coils 152. In an exemplary embodiment, a splitter-combiner configured/implemented in a selected form is then integrated with a balun transformer (implemented and employed as a ground notch filter). The integrated configuration of an exemplary embodiment replaces two existing separate elements while reducing insertion loss and increasing signal to noise ratio (SNR).

Figure 2:
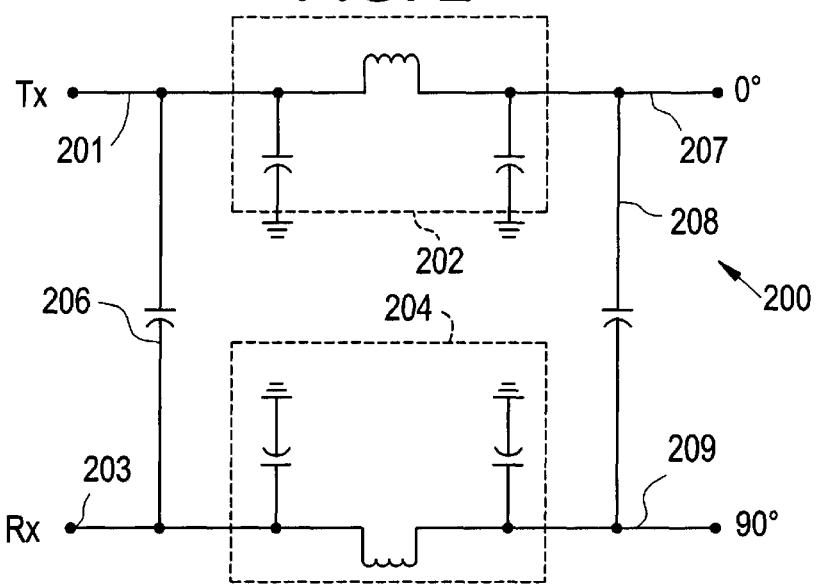
FIG. 2 depicts an existing quadrature splitter-combiner circuit configuration employing discrete components.

Turning now to FIG. 2, a circuit for an existing quadrature splitter-combiner 200 configuration employing discrete components is depicted. The circuit depicts two pi filters, phase shifters, 202 and 204 shunted together with two capacitors 206 and 208. The configuration as depicted is bi-directional, operating as a splitter of a single ended ground referenced signal applied at port 201 to two quadrature signals at ports 207 and 209 respectively in one direction and yet may also be a combiner of two quadrature signals applied at ports 207 and 209 respectively into a single signal output from port 203 in the other direction.

Figure 3:
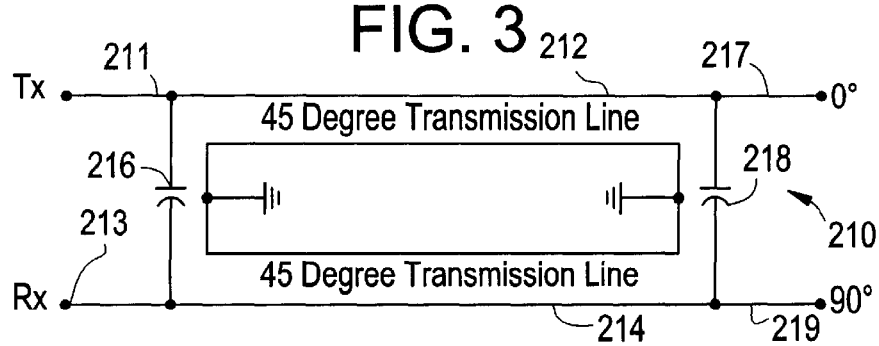
FIG. 3 depicts a quadrature splitter-combiner configuration employing a transmission line filter section.

Turning now to FIG. 3 another quadrature splitter-combiner 210 is depicted.

Here the quadrature splitter-combiner 210 is realized by employing two 45-degree (also called ⅛ wavelength) sections of coaxial transmission line 212 and 214 shunted together by capacitors 216 and 218. It will be appreciated that if the phase of a 50 ohm transmission line 212, and 214 is equal to about 45 degrees at a selected frequency and the reactance of the shunt capacitors 216 and 218 is about 50 ohms at the selected frequency, then all ports 211, 213, 217, 219 of the splitter-combiner 210 exhibit an impedance of 50 ohms at the selected frequency and power of the input signal applied at input port 211 will be split equally into two signals from the two output ports 217 and 219 having a phase of 0 and 90 degrees respectively. Similarly, as the circuit is symmetric, therefore it will be appreciated that it may also operate as a combiner, e.g., combining two signals that are out of phase by 90 degrees into one applied at ports 217 and 219 respectively into a single signal transmitted from port 213.

Figure 4:
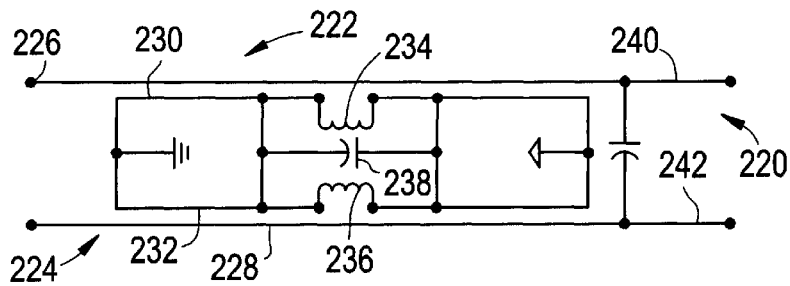
FIG. 4 depicts a balun impedance matching transformer configured with a transmission line.

Turning now to FIG. 4, a balanced to unbalanced (balun) transformer hereinafter balun 220 is depicted. A balun 220 receives an balanced RF input, e.g., referenced to ground, and creates a unbalanced output, single ended. Additionally, the balun 220 may utilized a notch filter applied in the shields of the transmission lines, inhibiting transmission of undesired frequencies. Moreover, the balun 220 may be configured as a filter to pass or attenuate only selected frequencies. In addition, a balun 220 may function equally well in reverse. That is, they can accept unbalanced first and second input signals and combine them into a balanced output signal referenced to a ground.

There are several different types of baluns 220 and splitter-combiner configurations, including stripline, microstrip, transformer types, twisted pair, and transmission line or coaxial cable types, and the like, as well as combinations including at least one of the foregoing. In an exemplary embodiment, a coaxial cable balun 220 comprises a coaxial cable transmission line 222 and 224 that have an inner conductors 226 and 228 respectively, and outer conductors 230 and 232 respectively, which may be a metallic sheath, which encases the inner conductors 226 and 228 respectively. Typically, balanced input RF signals are coupled to inner conductors 226 and 228. Unbalanced output signals are generated on conductors 240 and 242. The balanced signals on conductors 240 and 242 may optionally be coupled to amplifiers to obtain power amplification.

Continuing with FIG. 4, in an exemplary embodiment, each of the transmission lines 222 and 224 is formed from coaxial cable segments. Each segment has a length, L, which is approximately lambda/8 where lambda is the wavelength at the center frequency of the pass band of a selected frequency of interest. The length, L, could also be greater than or less than lambda/8 to act as an unequal power splitter-combiner. Continuing with FIG. 4, the coaxial cable transmission lines 222 and 224 are connected to ensure conductivity is maintained between outer conductors 230 and 232 along the entire length of the transmission lines 222 and 224. In an exemplary embodiment the outer conductors 230 and 232 are soldered together along their respective lengths. The connected transmission lines 222 and 224 are thereafter wound in a coil, helix, and the like to form a pair of air core inductors 234 and 236. A capacitor 238 is added shunting the ends of the inductors 234 and 236 to formulate a filter. It will be appreciated that the size of the inductors 234, 236 and the value of the capacitance for capacitor 238 may be selected to formulate a notch filter at a selected frequency. In an exemplary embodiment, the inductors 234 and 236 and capacitor 238 are selected so that the filter formulated exhibits a notch center frequency equivalent to the operating frequency designed for the splitter-combiner. The balun 220 is implemented as a notch filter in the outer conductors 230 and 232 of the transmission lines and configured to eliminate any currents on the shields of the transmission line. It will be appreciated and is well understood that elimination of currents on the transmission line enhances safety and prevents noise from passing through to other system components. It will be appreciated that the frequency of the balun and the combiner splitter are equal in this embodiment. However, in other implementations different frequencies could be employed. Such a configuration may be beneficial for image rejection and the like in transceiver applications.

Figure 5:
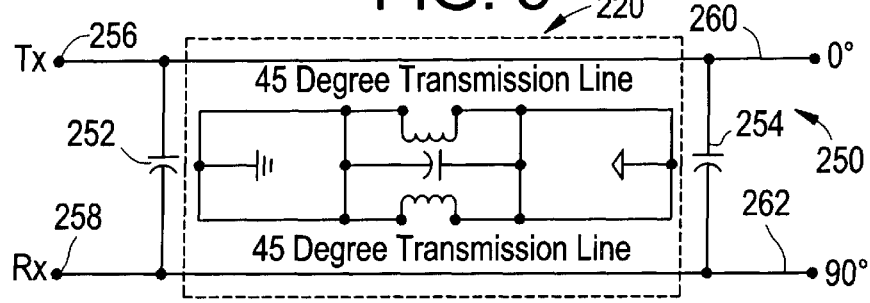
FIG. 5 depicts an integrated quadrature splitter-combiner and balun in accordance with an exemplary embodiment.

Turning now to FIG. 5 a schematic depiction of an integrated quadrature splitter-combiner and balun 250 in accordance with another exemplary embodiment is depicted. In an exemplary embodiment, the quadrature splitter-combiner 210 formulated with a transmission line and balun 220 are integrated. In this embodiment, the quadrature splitter-combiner and balun 250 are realized by employing the transmission line balun 220 described above shunted together by capacitors 252 and 254. A balanced input signal applied at port 256 results in quadrature unbalanced output signals that are generated on conductors at ports 260 and 262. These output signals are isolated from the input and are 90 degrees out of phase with each other. Once again, the balanced signals on ports 256 and 258 may be coupled to amplifiers to obtain power amplification. Earlier designs for a splitter-combiner and balun have been separate units, which are then cascaded with each other. Because the present integrated quadrature splitter-combiner and balun 250 performs both functions in a single stage, it occupies significantly less space than a cascaded arrangement.

Similar to the embodiments above, if the phase of a 50 ohm transmission lines e.g., 222, and 224 (FIG. 4) is equal to about 45 degrees and the reactance of the shunt capacitors 252 and 254 is about 50 ohms, then all ports 256, 258, 260, and 262 of the combiner/splitter and balun 250 exhibit an impedance of 50 ohms and power will be split equally into the two ports 260 and 262 having a phase of 0 and 90 degrees respectively. Similarly, it will further be appreciated that the circuit is symmetric and bi-directional, therefore it may also operate as a combiner, e.g., adding two signals that are out of phase by 90 degrees into one.

Figure 6:
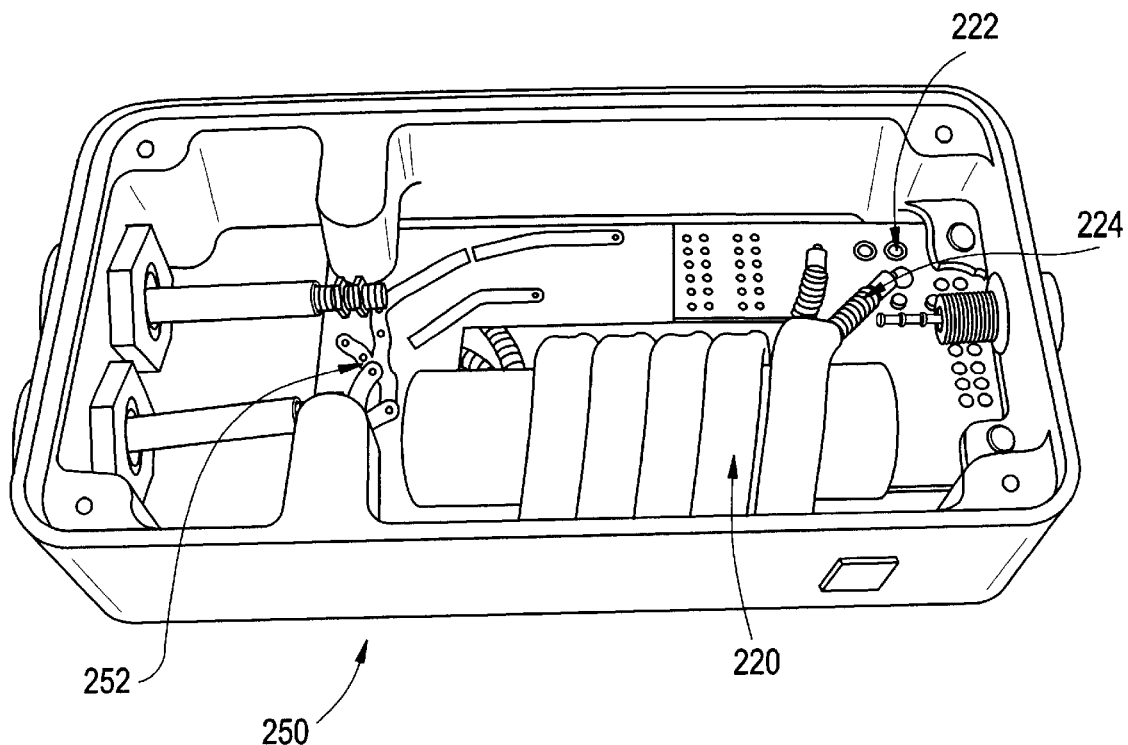
FIG. 6 depicts an integrated quadrature splitter-combiner and balun in accordance with an exemplary embodiment.

Turning now to FIG. 6 and continuing with FIGS. 3, 4, and 5, a quadrature splitter-combiner and balun 250 in accordance with another exemplary embodiment is depicted. In this embodiment, the quadrature splitter-combiner and balun 250 may be implemented utilizing two 45° (degree) (at the frequency of the desired application) coaxial cables transmission lines 222 and 224 soldered together to achieve a 0° and 90° power split. The 45° coax cable transmission lines 222 and 224 are soldered together along their length to ensure a common ground throughout the length of the combined cable. The shielded double coax cable is then covered in plastic heat shrink tubing or equivalent jacket insulation and wound into a coil to air core inductors 234 and 236 of the balun 220 (ground filter or cable trap). The balun 220 is designed to filter out any signal or noise at a selected frequency. The balun 220 is resonated by placing a capacitor 238 across the grounds on either side of the cable inductance. Placing capacitors 252 and 254 respectively of impedance of 50 ohms at the selected frequency at the ends, the combined system becomes a quadrature power splitter-combiner and balun at a selected frequency. In an exemplary embodiment, selected frequencies of 42.57, 63.86, and 127.72 megahertz respectively, have been utilized for MRI applications at 1.0 T (Tesla), 1.5 T, and 3.0 T.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. An integrated quadrature splitter-combiner and balun comprising:

a transmission line balun operably connected to between a first port and a second port and between a third port and a fourth port;

a first capacitor operably connected across said transmission line balun;

a second capacitor operably connected to said first port and said third portbalun;

a third capacitor operably connected to said second port and said fourth portbalun;

wherein said second capacitor, said third capacitor, and said transmission line balun combine to form an RF splitter-combiner to split a balanced RF signal received at said first port and said third port into a first and second unbalanced quadrature RF signal transmitted at said second port and said fourth port; and wherein said second capacitor, said third capacitor, and said transmission line balun combines said first and second unbalanced quadrature RF signals received at said second port and said fourth port into said balanced RF signal transmitted at said first port and said third port.

2. The integrated quadrature splitter-combiner and balun of claim 1 wherein said first capacitor operates in conjunction with said transmission line balun to provide a ground notch filter.

3. The integrated quadrature splitter-combiner and balun of claim 1 wherein said balun has a length of approximately lambda/8 where lambda is the wave length at a desired center frequency of one of said balanced RF signal and said first and second unbalanced quadrature RF signals.

4. The integrated quadrature splitter-combiner and balun of claim 1 wherein said balun has a length of greater than or less than lambda/8 to act as an impedance transformer where lambda is the wave length at a desired center frequency of one of said balanced RF signal and said first and second unbalanced quadrature RF signals.

5. The integrated quadrature splitter-combiner and balun of claim 1 wherein said balun exhibits a selected characteristic impedance to provide a ground notch filter.

6. The integrated quadrature splitter-combiner and balun of claim 1 wherein said second capacitor exhibits a selected characteristic impedance at the desired center frequency of the pass band of one of said balanced RF signal and said first and second unbalanced quadrature RF signals.

7. The integrated quadrature splitter-combiner and balun of claim 1 wherein said third capacitor exhibits a selected characteristic impedance at a desired center frequency of one of said balanced RF signal and said first and second unbalanced quadrature RF signals.

8. An integrated quadrature splitter and balun comprising:

a transmission line balun operably connected between a first port and a second port and between a third port and a fourth port;

a first capacitor operably connected across said transmission line balun;

a second capacitor operably connected to said first port and said third port;

a third capacitor operably connected to said second port and said fourth port;

wherein said second capacitor, said third capacitor, and said transmission line balun combine to form an RF splitter to split an balanced RF signal received at said first port and said third port into a first and second unbalanced quadrature RF signals transmitted at said second port and said fourth port.

9. The integrated quadrature splitter and balun of claim 8 wherein said first capacitor operates in conjunction with said transmission line balun to provide a ground notch filter.

10. The integrated quadrature splitter and balun of claim 8 wherein said balun has a length of approximately lambda/8 where lambda is the wavelength at a desired center frequency of said balanced RF signal.

11. The integrated quadrature splitter and balun of claim 8 wherein said balun has a length of greater than or less than lambda/8 to act as an impedance transformer where lambda is the wavelength at a desired center frequency of said balanced RF signal.

12. The integrated quadrature splitter and balun of claim 8 wherein said balun exhibits a selected characteristic impedance to provide a ground notch filter.

13. The integrated quadrature splitter and balun of claim 8 wherein said second capacitor exhibits a selected characteristic impedance at a desired center frequency of said balanced RF signal.

14. The integrated quadrature splitter and balun of claim 8 wherein said third capacitor exhibits a selected characteristic impedance at a desired center frequency of said balanced RF signal.

15. An integrated quadrature combiner and balun comprising:
    a transmission line balun operably connected to between a first port and a second port and a third port and a fourth port;
    a first capacitor operably connected across said transmission line balun;
    a second capacitor operably connected to said first port and said third portbalun;
    a third capacitor operably connected to said second port and said fourth port;
    wherein said second capacitor, said third capacitor, and said transmission line balun combine to form an RF combiner to combine an unbalanced quadrature RF signal received at said second port and said fourth port into a balanced RF signal transmitted at said first port and said third port.

16. The integrated quadrature combiner and balun of claim 15 wherein said first capacitor operates in conjunction with said transmission line balun to provide a ground notch filter.

17. The integrated quadrature combiner and balun of claim 15 wherein said balun has a length of approximately lambda/8 where lambda is the wavelength at a desired center frequency of said unbalanced quadrature RF signals.

18. The integrated quadrature combiner and balun of claim 15 wherein said balun has a length of greater than or less than lambda/8 to act as an impedance transformer where lambda is the wave length at a desired center frequency of said unbalanced quadrature RF signals.

19. The integrated quadrature combiner and balun of claim 15 wherein said balun exhibits a selected characteristic impedance to provide a ground notch filter.

20. The integrated quadrature splitter-combiner and balun of claim 15 wherein said second capacitor exhibits a selected characteristic impedance at a desired center frequency said unbalanced quadrature RF signals.

21. The integrated quadrature splitter-combiner and balun of claim 15 wherein said third capacitor exhibits a selected characteristic impedance at a desired center frequency of said unbalanced quadrature RF signals.

22. A system comprising:
    an imaging system with quadrature RF coils;
    an integrated quadrature splitter or combiner and balun comprising:
        a transmission line balun operably connected between a first port and a second port and between a third port and a fourth port;
        a first capacitor operably connected across said transmission line balun;
        a second capacitor operably connected to said first port and said third port;
        a third capacitor operably connected to said second port and said fourth port;
        wherein said second capacitor, said third capacitor, and said transmission line balun combine to form an RF splitter or combiner to
            either split a balanced RF signal received at said first port and said third port into a first and second unbalanced quadrature RF signals transmitted at said second port and said fourth port; or to combine said first and second unbalanced quadrature RF signals received at said second port and said fourth port into said balanced RF signal transmitted at said first port and said third port.

23. A magnetic system comprising:
    a magnetic resonance imaging system with quadrature RF coils;
    an integrated quadrature splitter-combiner and balun comprising:
        a transmission line balun operably connected between a first port and a second port and between a third port and a fourth port;
        a first capacitor operably connected across said transmission line balun;
        a second capacitor operably connected to said first port and said third port;
        a third capacitor operably connected to said second port and said fourth port;
        wherein said second capacitor, said third capacitor, and said transmission line balun combine to form an RF splitter or combiner to either:
            split a balanced RF signal received at said first port and said third port into a first and second unbalanced quadrature RF signals transmitted at said second port and said fourth port; or to combine said first and second unbalanced quadrature RF signals received at said second port and said fourth port into said balanced RF signal transmitted at said first port and said third port.

24. A method of splitting a balanced RF signal into unbalanced quadrature RF signals comprising:
    receiving a balanced RF signal at a first port and a third port of an integrated quadrature splitter and balun, said integrated quadrature splitter and balun comprising:
        a transmission line balun operably connected between said first port and a second port and between said third port and a fourth port;
        a first capacitor operably connected across said transmission line balun;
        a second capacitor operably connected to said first port and said third port;
        a third capacitor operably connected to said second port and said fourth port;
        wherein said second capacitor, said third capacitor, and said transmission line balun combine to form an RF splitter; and
    generating a first and second unbalanced quadrature RF signals transmitted at said second port and said fourth port.

25. A method of combining unbalanced quadrature RF signals into a balanced RF signal comprising:
- receiving a first and a second unbalanced quadrature RF signals at a second port and a fourth port of an integrated quadrature combiner and balun, said integrated quadrature combiner and balun comprising:
  - a transmission line balun operably connected between first port and said second port and a third port and a fourth port;
  - a first capacitor operably connected across said transmission line balun;
  - a second capacitor operably connected to said first port and said third port;
  - a third capacitor operably connected to said second port and said fourth port;
  - wherein said second capacitor, said third capacitor, and said transmission line balun combine to form an RF combiner; and
- generating a balanced RF signal transmitted at said first port and said fourth port.

* * * * *

UNITED STATES PATENT AND TRADEMARK OFFICE
CERTIFICATE OF CORRECTION

PATENT NO. : 6,750,652 B2 Page 1 of 1
APPLICATION NO. : 10/065465
DATED : June 15, 2004
INVENTOR(S) : Weyers et al.

It is certified that error appears in the above-identified patent and that said Letters Patent is hereby corrected as shown below:

Column 8:
Line 1, after "connected" delete "to"
Line 7, after "third" delete "port balun" and insert therefor -- port --
Line 9, after "fourth" delete "portbalun" and insert therefor -- port --

Column 9:
Line 26, after "connected" delete "to"
Line 32, after "third" delete "portbalun" and insert therefor -- port --

Column 10:
Line 23, after "A" delete "magnetic"

Signed and Sealed this

Eleventh Day of July, 2006

JON W. DUDAS
*Director of the United States Patent and Trademark Office*